US011844221B2

United States Patent
Liang et al.

(10) Patent No.: US 11,844,221 B2
(45) Date of Patent: Dec. 12, 2023

(54) 3D FLASH MEMORY DEVICE WITH INTEGRATED PASSIVE DEVICE

(71) Applicant: MACRONIX International Co., Ltd., Hsinchu (TW)

(72) Inventors: Li-Yen Liang, Kaohsiung (TW); Teng-Hao Yeh, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 225 days.

(21) Appl. No.: 17/409,431

(22) Filed: Aug. 23, 2021

(65) Prior Publication Data
US 2023/0058855 A1 Feb. 23, 2023

(51) Int. Cl.
*H10B 43/35* (2023.01)
*H10B 43/10* (2023.01)
(Continued)

(52) U.S. Cl.
CPC ......... *H10B 43/35* (2023.02); *H01L 23/5226* (2013.01); *H10B 43/10* (2023.02); *H10B 43/27* (2023.02); *H10B 43/40* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10;
(Continued)

(56) References Cited

U.S. PATENT DOCUMENTS

| | | | | |
|---|---|---|---|---|
| 2007/0252201 A1* | 11/2007 | Kito | ................. | H10B 69/00 257/E21.679 |
| 2016/0190143 A1* | 6/2016 | Chuang | ................. | H01L 29/408 257/326 |

(Continued)

FOREIGN PATENT DOCUMENTS

| | | |
|---|---|---|
| CN | 103681684 | 3/2014 |
| CN | 105845687 | 8/2016 |

(Continued)

OTHER PUBLICATIONS

"Office Action of Taiwan Counterpart Application", dated May 23, 2022, p. 1-p. 7.

*Primary Examiner* — Didarul A Mazumder
*Assistant Examiner* — Gustavo G Ramallo
(74) *Attorney, Agent, or Firm* — J.C. PATENTS (57) ABSTRACT

A 3D flash memory device such as a 3D AND flash memory device is provided. The 3D flash memory device includes a substrate, a conductive layer, a 3D flash memory array, and through-array vias (TAVs). The substrate includes a memory cell region and a passive device region. The conductive layer is formed on the substrate, and the conductive layer includes: a first circuit disposed at the memory cell region and a second circuit of a passive device disposed at the passive device region. The 3D flash memory array is formed on the first circuit of the memory cell region. The TAVs are respectively formed on the second circuit of the passive device disposed at the passive device region and connected to at least one end of the second circuit.

15 Claims, 13 Drawing Sheets (51) Int. Cl.
*H10B 43/40* (2023.01)
*H01L 23/522* (2006.01)
*H10B 43/27* (2023.01)

(58) Field of Classification Search
CPC ........ H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50; H01L 29/40114; H01L
29/40117; H01L 29/42328; H01L
29/42333
See application file for complete search history.

(56) References Cited

U.S. PATENT DOCUMENTS

| | | | | |
|---|---|---|---|---|
| 2017/0148517 A1* | 5/2017 | Harari | ............... | H01L 29/4234 |
| 2018/0350831 A1* | 12/2018 | Kim | ................... | G11C 11/4099 |
| 2021/0028190 A1 | 1/2021 | Kim et al. | | |
| 2021/0242224 A1* | 8/2021 | Kim | ..................... | H10B 41/27 |

FOREIGN PATENT DOCUMENTS

| | | |
|---|---|---|
| CN | 110544696 | 12/2019 |
| CN | 113228251 | 8/2021 |

\* cited by examiner

FIG. 6

3D FLASH MEMORY DEVICE WITH INTEGRATED PASSIVE DEVICE

BACKGROUND OF THE INVENTION

Field of the Invention

The invention relates to the field of flash memory, and particularly relates to a 3D flash memory device.

Description of Related Art

Since a non-volatile memory (such as a flash memory) has the advantage of retaining stored data even in a power failure, the non-volatile memory device has become a widely adopted memory in personal computers and other electronic equipment.

With the development of process techniques, circuit design, and programming algorithms, the size of memory devices is significantly reduced in order to achieve a higher degree of integration. However, due to the limitation of the manufacturing process, the size of traditional planar memory devices may no longer meet the requirements of size reduction.

Therefore, 3D flash memory devices are currently being developed to solve the above issue encountered by planar memories. The 3D flash memory device architecture includes a 3D flash memory array and peripheral devices. In addition, 3D flash memory devices also include some passive devices, such as capacitors or resistors. These passive devices are generally manufactured on top of the 3D flash memory array after the manufacture of the 3D flash memory array is completed.

However, above passive devices usually require additional mask and processes that induce higher cost and risk of defect formation which might impact wafer yield.

SUMMARY OF THE INVENTION

The invention provides a 3D flash memory device that may integrate a passive device and a 3D flash memory array at the same layer, so as to reduce the photomask manufacturing process, thereby reducing manufacturing cost and the probability of defect formation.

A 3D flash memory device of the invention includes a substrate, a conductive layer, a 3D flash memory array, and through-array vias (TAVs). The substrate includes a memory cell region and a passive device region. The conductive layer is formed on the substrate, and the conductive layer includes: a first circuit disposed at the memory cell region and a second circuit of a passive device disposed at the passive device region. The 3D flash memory array is formed on the first circuit of the memory cell region. The TAVs are respectively formed on the second circuit of the passive device region and connected to at least one end of the second circuit.

Another 3D flash memory device of the invention includes a substrate, a conductive layer, a 3D flash memory array, and through-array vias (TAVs). The substrate includes a memory cell region and a passive device region. The conductive layer is formed on the substrate, and the conductive layer includes: a circuit of a passive device disposed at the passive device region and an etch-stop layer disposed at the memory cell region. The 3D flash memory array is formed on the etch-stop layer of the memory cell region, wherein the 3D flash memory array includes a stack structure and a plurality of pillar structures. The stack structure includes a plurality of insulating layers and a plurality of gate layers alternately disposed. The pillar structures penetrate the stack structure. Each of the pillar structure includes an insulating pillar, a source pillar and a drain pillar located at two sides of the insulating pillar and extended to a surface of the etch-stop layer, a channel layer surrounding the source pillar and the drain pillar and in contact with the source pillar and the drain pillar, and a charge storage layer. The charge storage layer surrounds the channel layer and is in contact with the gate layers of the stack structure. The TAVs are respectively formed on the circuit of the passive device region and connected to at least one end of the circuit.

A 3D NAND flash memory device of the invention includes a substrate, a conductive layer, a 3D NAND flash memory array, and through-array vias (TAVs). The substrate includes a memory cell region and a passive device region. The conductive layer is formed on the substrate, and the conductive layer includes: a circuit of a passive device disposed at the passive device region and a source line disposed at the memory cell region. The 3D NAND flash memory array is formed on the source line of the memory cell region. The TAVs are respectively formed on the circuit of the passive device region and connected to at least one end of the circuit.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The disclosure below provides numerous different embodiments or examples for implementing different features of the invention. Moreover, these embodiments are merely exemplary and are not intended to limit the scope and application of the invention. Furthermore, for the sake of clarity, the relative dimensions (such as length, thickness, pitch, etc.) and relative positions of each region or structural element may be reduced or enlarged. Moreover, similar or the same reference numerals are used in each figure to represent similar or the same devices or features.

Figure 1:
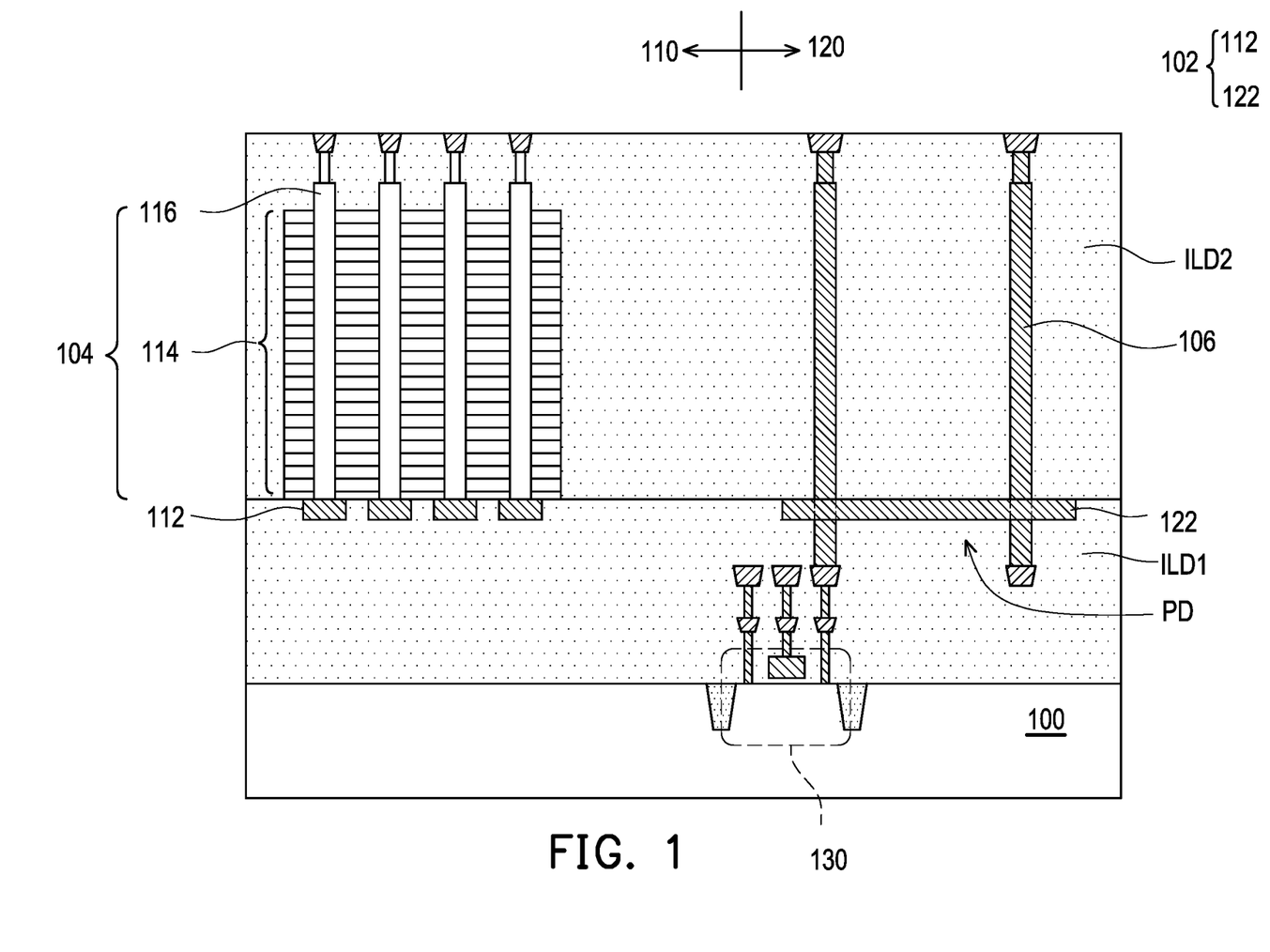
FIG. 1 is a schematic cross-sectional view of a 3D flash memory device according to the first embodiment of the invention.

FIG. 1 is a schematic cross-sectional view of a 3D flash memory device according to the first embodiment of the invention.

Referring to FIG. 1, the 3D flash memory device of the present embodiment includes a substrate 100, a conductive layer 102, a 3D flash memory array 104, and through-array vias (TAVs) 106. The substrate 100 includes a memory cell region 110 and a passive device region 120. The conductive layer 102 is formed on the substrate 100, and the conductive layer 102 includes: a first circuit 112 disposed at the memory cell region 110 and a second circuit 122 of a passive device PD disposed at the passive device region 120. The 3D flash memory array 104 is formed on the first circuit 112 of the memory cell region 110. The through-array vias 106 are respectively formed on the second circuit 122 of the passive device region 120 and connected to at least one end of the second circuit 122 as a terminal connection of the passive device PD. The passive device PD is, for example, a capacitor or a resistor, as shown in the schematic top view of FIG. 2A and FIG. 2B. Since the passive device PD may be manufactured together with the circuits in the 3D flash memory array 104, no additional photomask and manufacturing process are needed, thereby reducing manufacturing cost and the probability of defect formation.

Figure 2A:
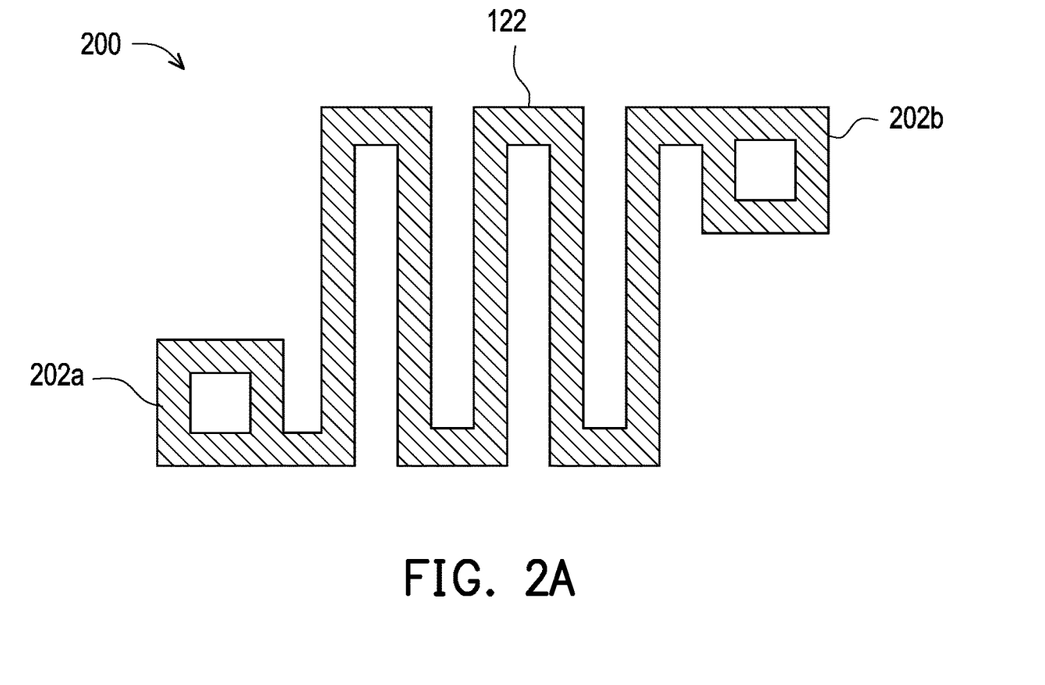
FIG. 2A is a schematic top view of a passive device in FIG. 1.

In FIG. 2A, the passive device is a resistor 200, and the second circuit 122 is, for example, a snake-shaped circuit. Two ends of the second circuit 122 may be ring-type structures 202a and 202b, and the through-array vias 106 in FIG. 1 may pass through the central openings of the ring-type structures 202a and 202b to be connected to a lower device, such as a CMOS (complementary metal-oxide-semiconductor) 130 in FIG. 1.

Figure 2B:
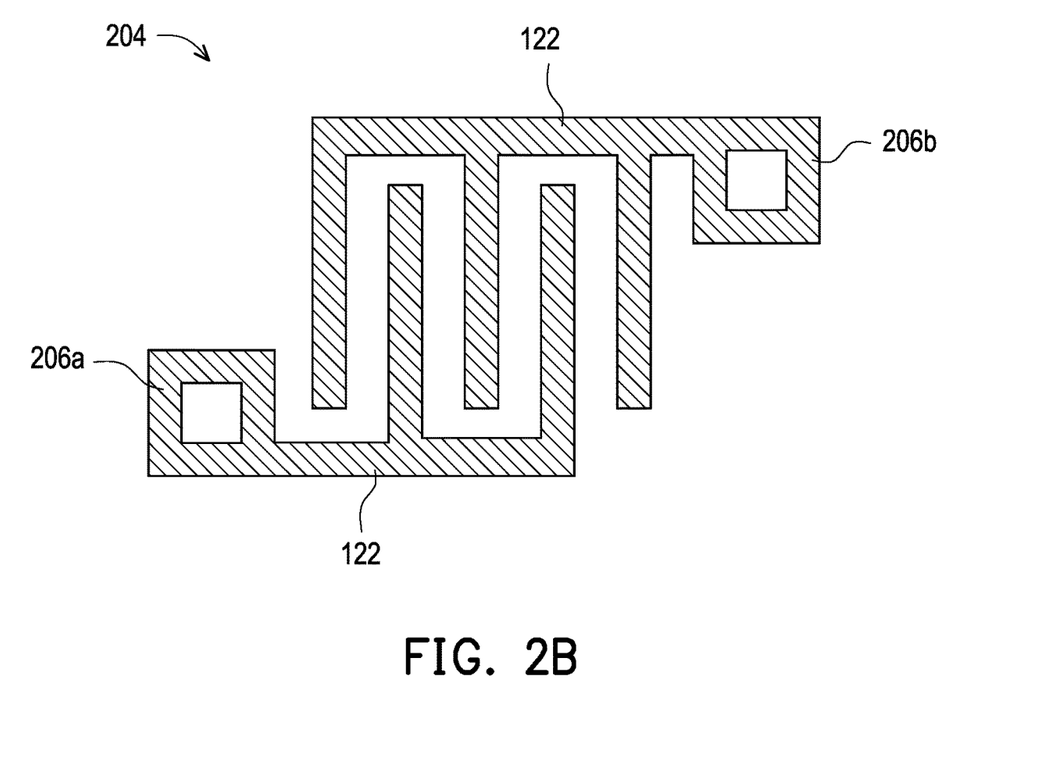
FIG. 2B is a schematic top view of another passive device in FIG. 1.

In FIG. 2B, the passive device is a capacitor 204, and the second circuit 122 is, for example, a snake-shaped circuit, and therefore one end of one second circuit 122 is a ring-type structure 206a, and one end of another second circuit 122 is a ring-type structure 206b. In addition, the through-array vias 106 in FIG. 1 may pass through the central openings of the ring-type structures 206a and 206b to be connected to a lower device.

Referring further to FIG. 1, the 3D flash memory array 104 may include a stack structure 114 and a pillar structure 116, wherein the stack structure 114 is, for example, insulating layers and gate layers alternately disposed, and the pillar structure 116 penetrates the stack structure 114, and the detailed structure of the pillar structure 116 may be different according to different types of memories. In an embodiment, the 3D flash memory array 104 is a 3D AND flash memory array, and the first circuit 112 is an etch-stop layer at the bottom of the source pillar and drain pillar in the 3D AND flash memory array. In another embodiment, the 3D flash memory array 104 is a 3D NAND flash memory array, and the first circuit 112 is a source line (SL) in the 3D NAND flash memory array. For detailed description of different types of memories, please refer to the second and third embodiments below. The through-array vias 106 in the present embodiment generally refer to conductive pillars used to connect to each gate layers in the stack structure 114 after the 3D flash memory array 104 is formed. In addition, the 3D flash memory device of the present embodiment may also include general interconnects and dielectric layers ILD1, ILD2, etc., and according to the consideration of the process sequence, a portion of the stack structure 114 (not shown) may remain at the passive device region 120.

Figure 3A:
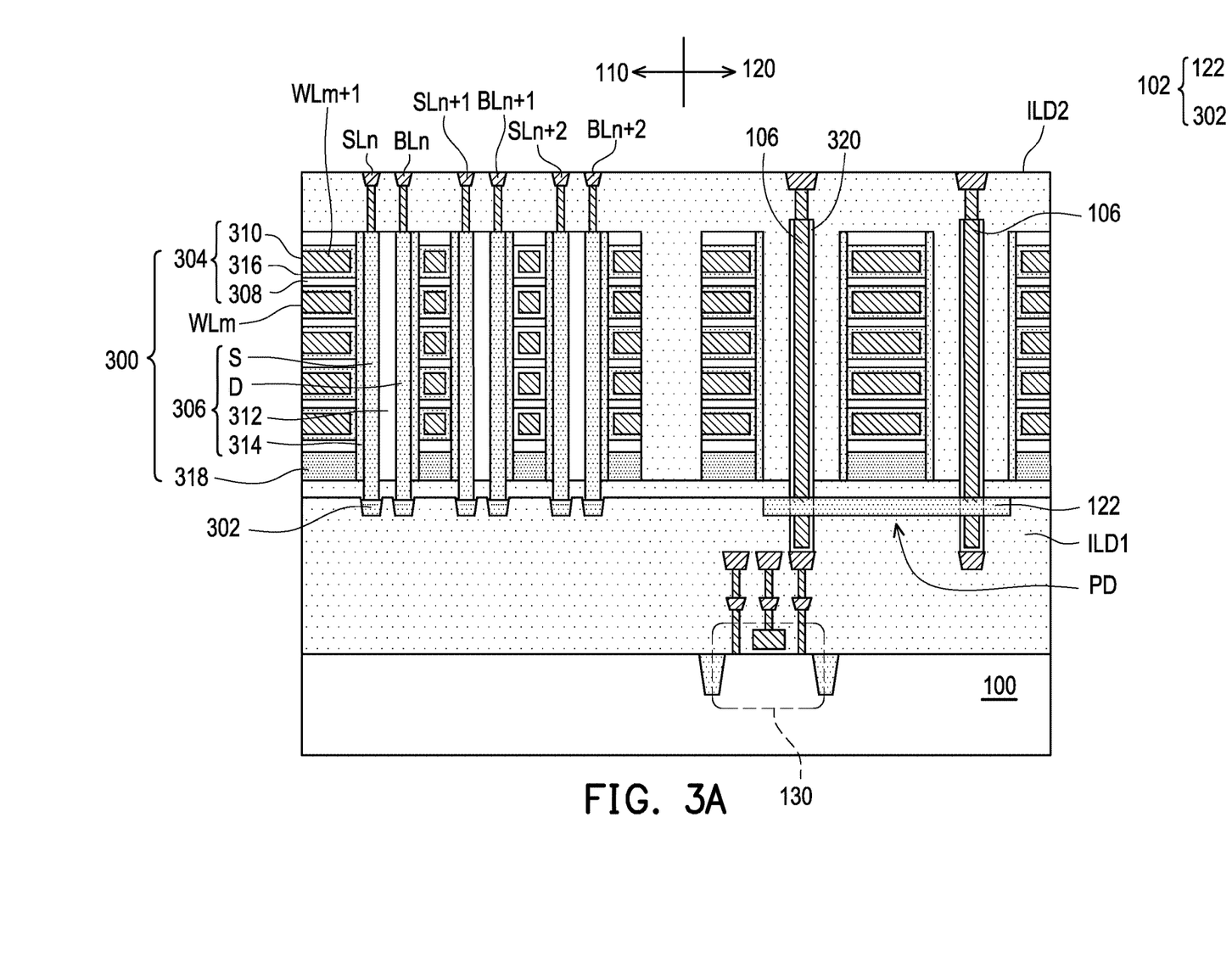
FIG. 3A is a schematic cross-sectional view of a 3D flash memory device according to the second embodiment of the invention.

FIG. 3A is a schematic cross-sectional diagram of a 3D flash memory device according to the second embodiment of the invention, wherein the same reference numerals as those in the first embodiment are used to indicate the same or similar parts and components, and related content of the same or similar parts and components is also as provided in the content of the first embodiment and is not repeated herein.

Referring to FIG. 3A, the 3D flash memory device of the present embodiment includes the substrate 100, the conductive layer 102, a 3D flash memory array 300, and the through-array vias (TAVs) 106. The conductive layer 102 includes: an etch-stop layer 302 disposed at the memory cell region 110 and the (second) circuit 122 of the passive device PD disposed at the passive device region 120. The 3D flash memory array 300 is formed on the etch-stop layer 302 of the memory cell region 110, wherein the 3D flash memory array 300 may include a stack structure 304 and a plurality of pillar structures 306. The stack structure 304 includes insulating layers 308 and gate layers 310 alternately disposed, wherein the gate layers 310 are used as word lines $WL_m$, $WL_{m+1}$ . . . A plurality of charge storage layers 316 surround the gate layers 310. Each of the charge storage layers 316 is between the respective gate layer 310 and insulating layer 308. The pillar structures 306 penetrate the stack structure 304, and each of the pillar structures 306 include an insulating pillar 312, a channel layer 314, the source pillar S and the drain pillar D. The source pillar S and the drain pillar D are located at two sides of the insulating pillar 312 and extended to the surface of the etch-stop layer 302. The channel layer 314 surrounds the source pillar S and the drain pillar D and is in contact with the source pillar S and the drain pillar D. The charge storage layer 316 surrounds the channel layer 314 and is in contact with the gate layers 310 of the stack structure 304. Since the source pillar S and the drain pillar D are also columnar structures, through holes need to be etched at the positions where the source pillar S and the drain pillar D are to be formed during the forming process. Therefore, the etch-stop layer 302 needs to be disposed under the pillar structure 306. In the present embodiment, the material of the source pillar S and the drain pillar D is, for example, polysilicon or doped polysilicon; since the etch-stop layer 302 is formed together with the circuit 122, the material of the etch-stop layer 302 is also a conductive material, such as metal, polysilicon, or doped polysilicon. The material of the insulating pillar 312 is, for example, silicon nitride to prevent the source pillar S and the drain pillar D from bridging. The material of the channel layer 314 is, for example, a semiconductor material, such as polysilicon or doped polysilicon. The charge storage layer 316 is, for example, a multiple layer of oxide/nitride/oxide (ONO), or other dielectric material layers In addition, the 3D flash memory array 300 may also include another gate layer 318 disposed under the stack structure 304 and above the etch-stop layer 302.

Figure 3B:
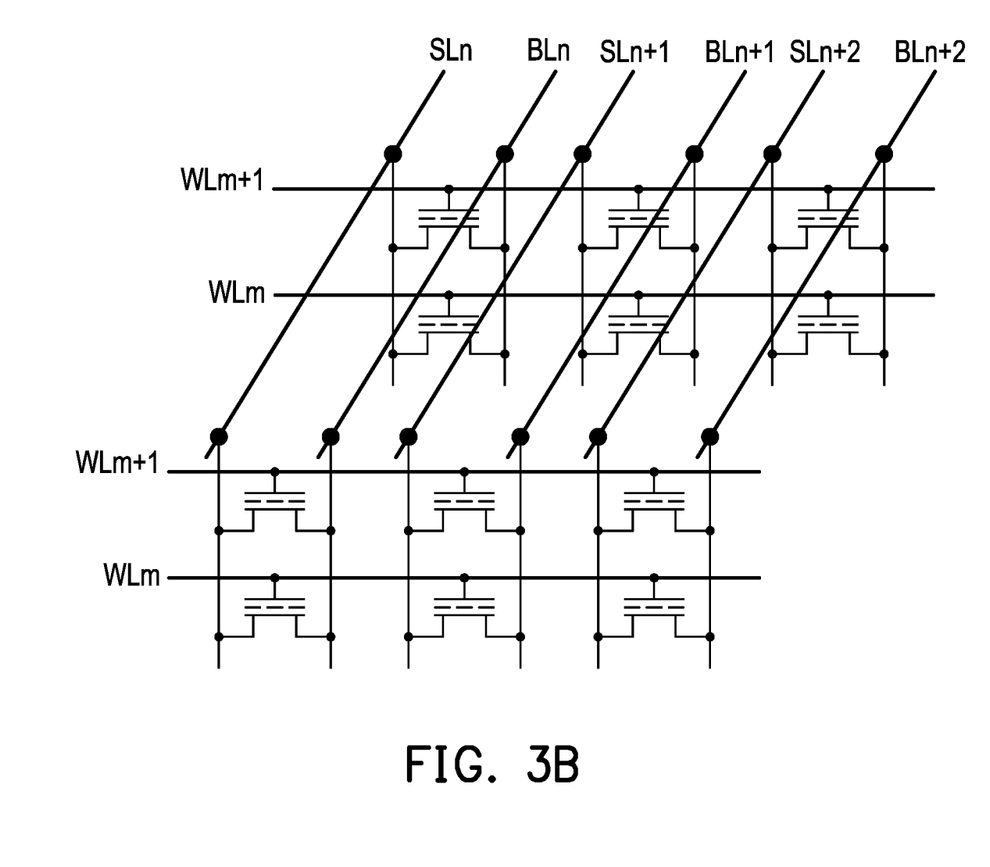
FIG. 3B is an equivalent circuit diagram of the 3D flash memory array of FIG. 3A.

FIG. 3B is an equivalent circuit diagram of the 3D flash memory array 300 of FIG. 3A, wherein only a portion of the memory cells are shown in order to prevent the figure from not being clear enough. The memory cells of each layer (m-th, (m+1)-th . . . layer) in FIG. 3B are all connected in parallel. In other words, the memory cells in a same column of each layer shared the same source pillar S is respectively connected to a same source line $SL_n$, $SL_{n+1}$ . . . ; and the memory cells in a same column of each layer shared the same drain pillar D is respectively connected to a same bit line $BL_n$, $BL_{n+1}$ . . .

Figure 4A:
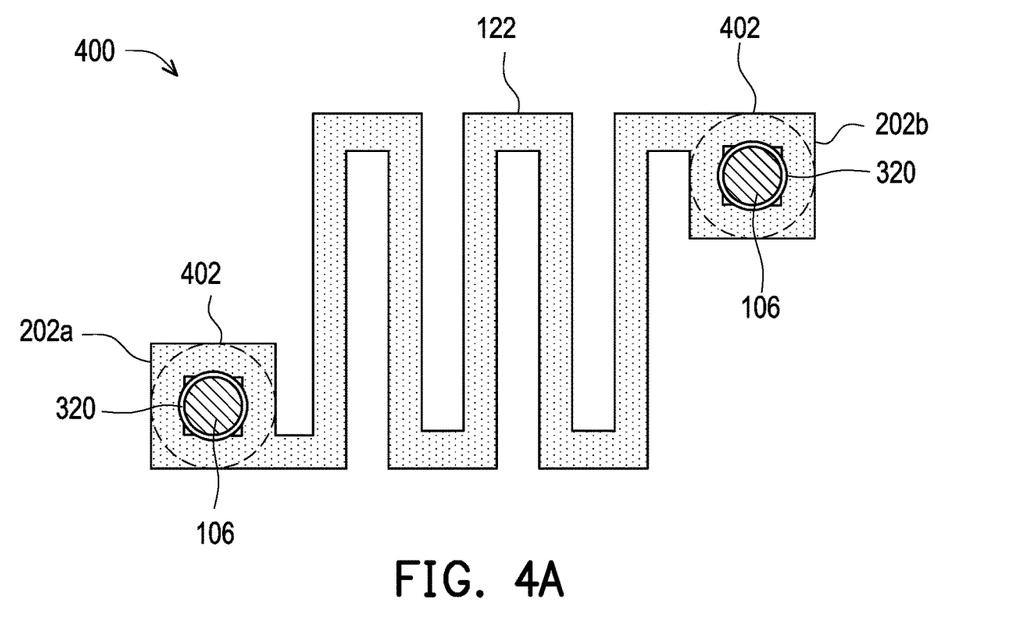
FIG. 4A is a schematic top view of a passive device in FIG. 3A.
Figure 4B:
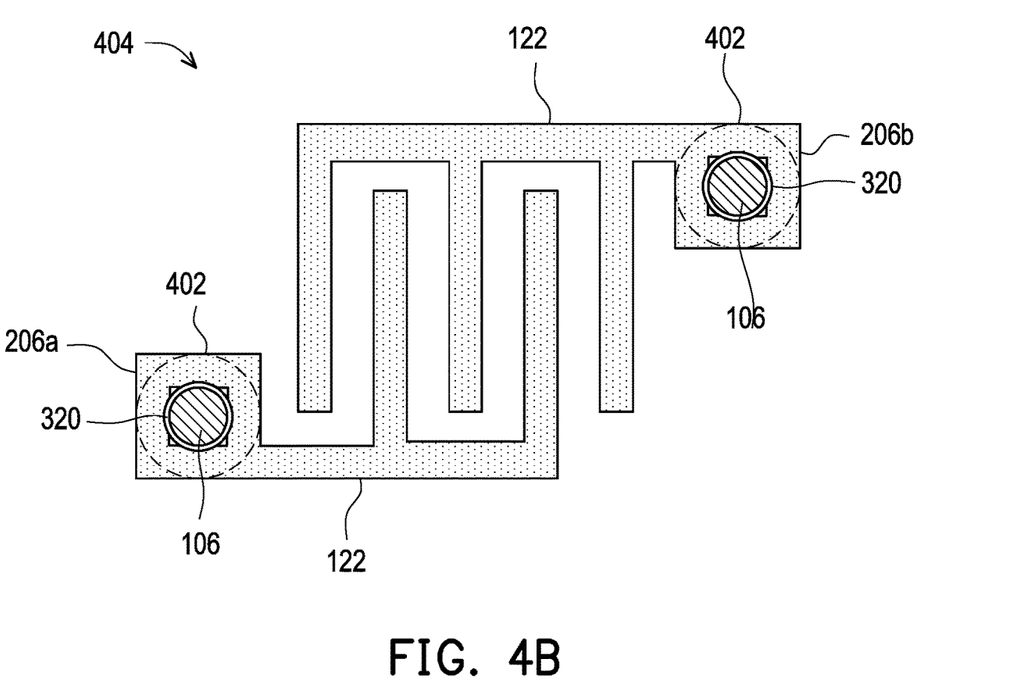
FIG. 4B is a schematic top view of another passive device in FIG. 3A.

Referring further to FIG. 3A, the through-array vias 106 are formed on the circuit 122 of the passive device region 120 and connected to at least one end of the circuit 122, and the passive device PD is, for example, a resistor 400 in the top view FIG. 4A or a capacitor 404 in the top view FIG. 4B.

In FIG. 4A, the resistor 400 is the same as the resistor 200 of FIG. 2A, and the positions of the through-array vias 106 are shown in FIG. 4A. That is, the through-array vias 106 pass through the central openings of the ring-type structures 202a and 202b to be connected to a lower device (such as the CMOS 130 in FIG. 3A). The through-array vias 106 are, for example, tungsten plugs, and therefore a barrier layer 320 (such as Ti/TiN) may be disposed between the through-array vias 106 and the dielectric layer ILD2. A metal silicide (not shown) may also be formed at the interface of the through-array vias 106 and the ring-type structures 202a and 202b. The one opening 402 represented by the dotted circle in the figure is formed at the same time as the pillar structure 306 passing through the stack structure 304 in FIG. 3A. The detailed manufacturing process is described below. In FIG. 4B, the capacitor 404 has an interdigital circuit 122 like the capacitor 204 of FIG. 2B, and the through-array vias 106 pass through the central openings of the ring-type structures 206a and 206b to be connected to a lower device.

FIG. 5A to FIG. 5H are schematic cross-sectional views of a manufacturing process of the 3D AND flash memory device of the second embodiment, wherein the same reference numerals as in FIG. 3A are used to represent the same or similar parts and components, and related content of the same or similar parts and components is as provided in the content of FIG. 3A, which is not repeated herein.

Figure 5A:
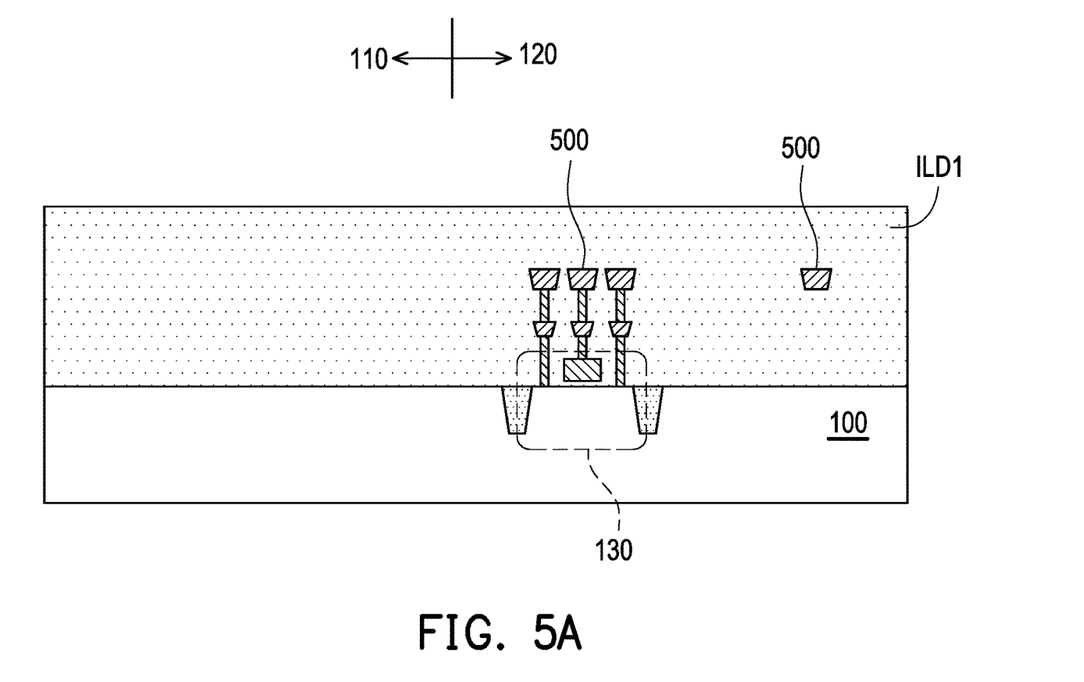
FIG. 5A to FIG. 5H are schematic cross-sectional views of a manufacturing process of the 3D AND flash memory device of the second embodiment.

Referring to FIG. 5A first, the CMOS 130 is formed on the substrate 100, and then interconnect structures, such as the dielectric layer ILD1 and an interconnect 500, are formed.

Figure 5B:
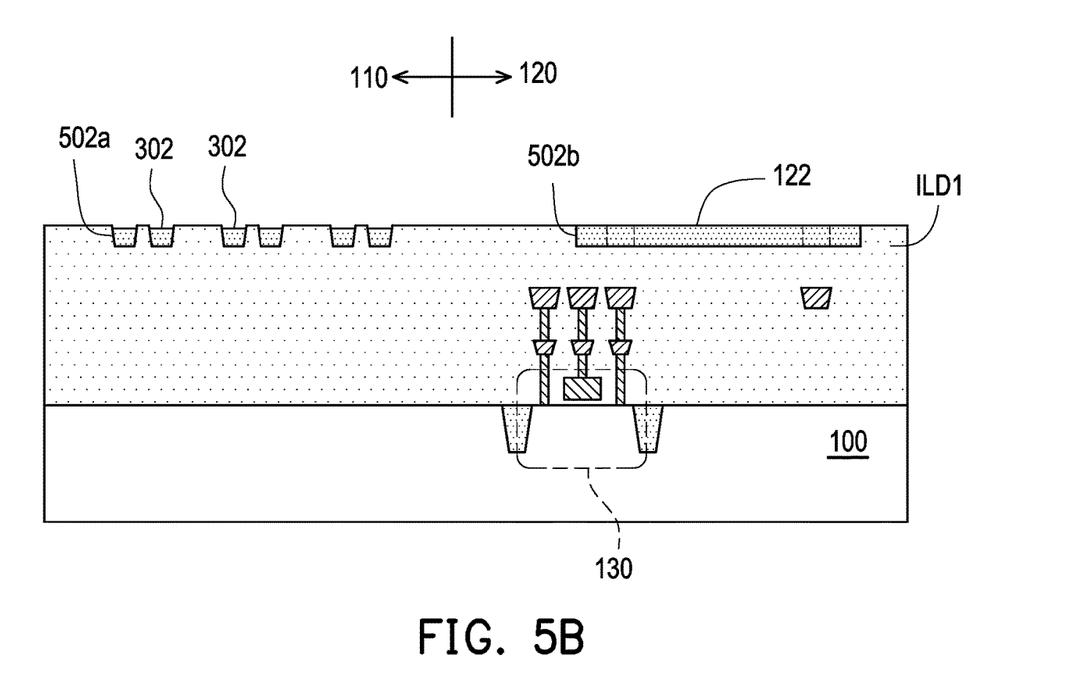

Next, referring to FIG. 5B, the circuit 122 and the etch-stop layer 302 are formed at the surface of the dielectric layer ILD1 at the same time. For example, openings 502a and 502b are first formed using a photomask process at the surface of the dielectric layer ILD1, and then a conductive material (such as polysilicon) is filled therein, and the surface of the etch-stop layer 302 of the memory cell region 110 may be lower than the surface of the dielectric layer ILD1 by etching back. At this time, if a photomask is formed beforehand to protect the circuit 122, the circuit 122 is not concaved; on the contrary, the surface of the circuit 122 may also be lower than the surface of the dielectric layer ILD1.

Figure 5C:
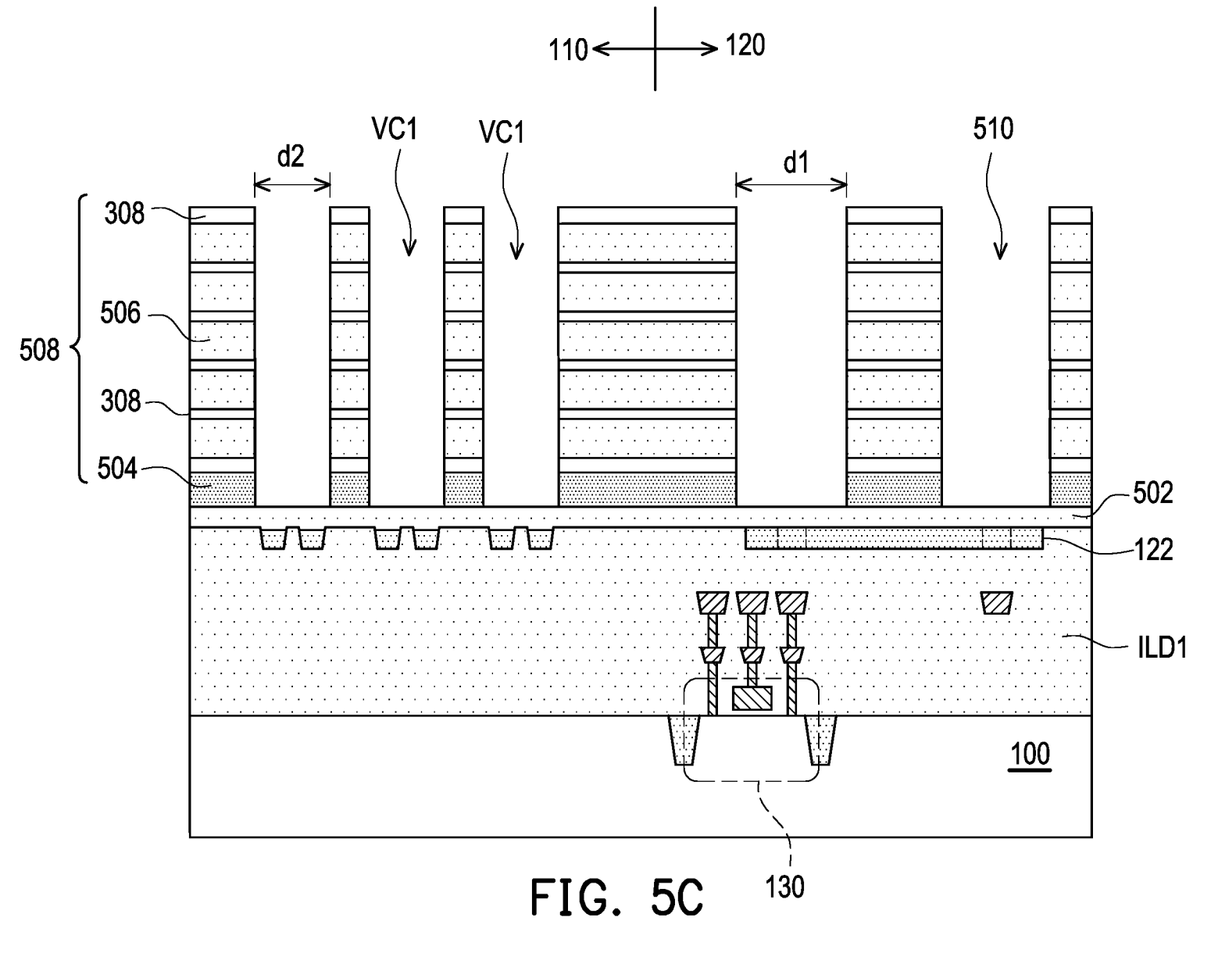

Next, referring to FIG. 5C, an insulating layer 502, a polysilicon layer 504, and a stack structure 508 composed of the insulating layers 308 and sacrificial layers 506 are sequentially formed on the ILD1. Then, via another photomask process, a plurality of vertical channel holes VC1 are formed in the memory cell region 110 and a plurality of openings 510 are formed in the passive device region 120 at the same time. In particular, the vertical channel holes VC1 are the positions where the pillar structure (306 in FIG. 3A) is subsequently formed, and the openings 510 are the positions where the contact of the circuit 122 is exposed. Therefore, if one or two ends of the circuit 122 have a ring-type structure, a diameter d1 of the openings 510 is correspondingly larger, which is larger than a diameter d2 of the vertical channel holes VC1 of the memory cell region 110.

Figure 5D:
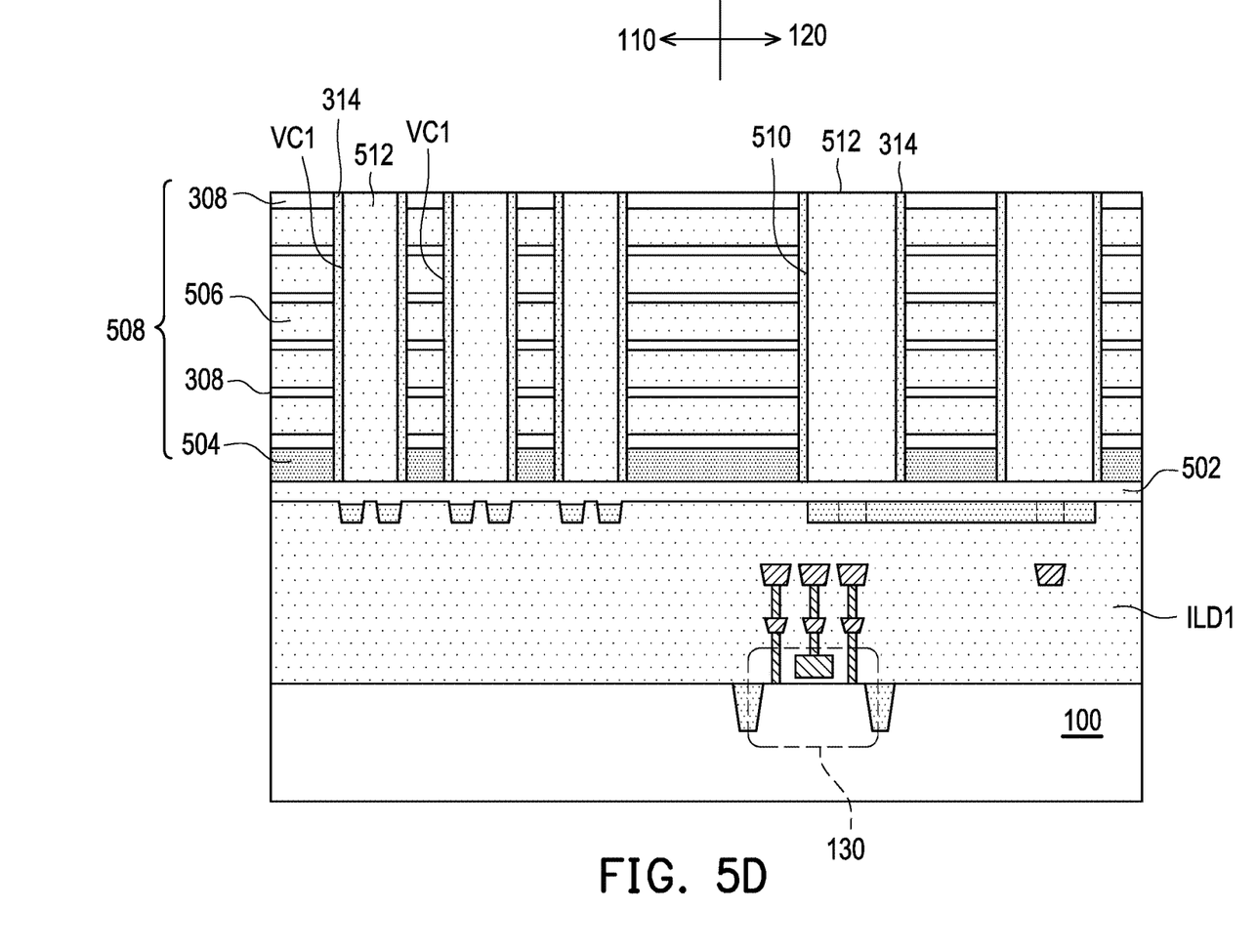

Next, referring to FIG. 5D, first, the channel layer 314 is formed at the sidewall of the vertical channel holes VC1. At this time, the channel layer 314 is also formed at the sidewall of the openings 510 at the same time. The channel layer 314 may be a conformal layer. In detail, the channel layer 314 may conform to the profile of the vertical channel holes VC1/openings 510 to cover the sidewall thereof and expose a portion of the insulating layer 502. Next, an insulating material 512 may be filled in the vertical channel holes VC1 and the openings 510, and the insulating material 512 is, for example, a material similar to the insulating layer 502 and the insulating layer 308, such as silicon oxide.

Figure 5E:
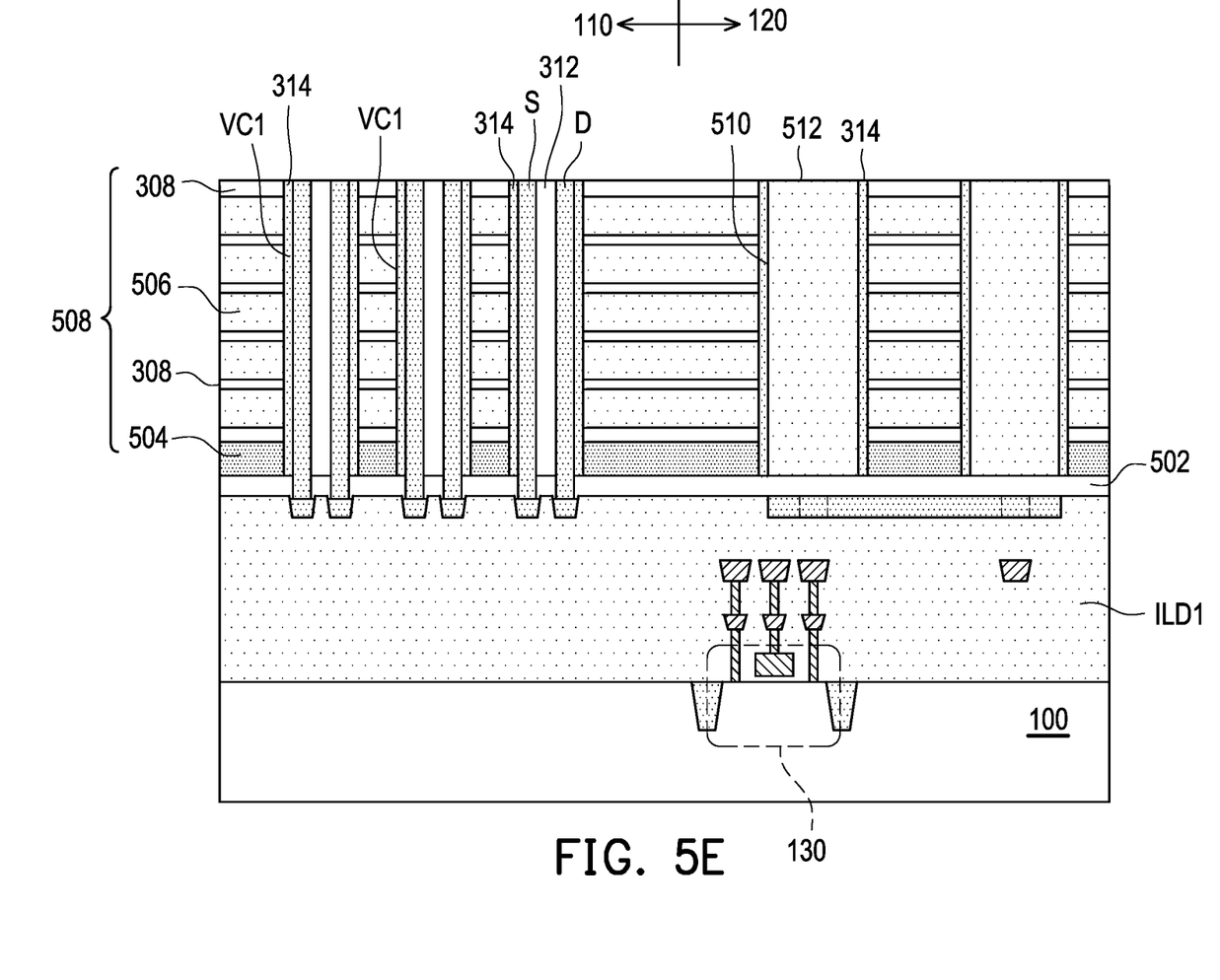

Next, referring to FIG. 5E, the insulating material 512 in the vertical channel holes VC1 of the memory cell region 110 may be removed first, and the source pillar S, the drain pillar D, and the insulating pillar 312 are formed therein. For example, the insulating pillar 312 may be formed in the vertical channel holes VC1 first, and then through holes are etched to the surface of the etch-stop layer 302 at the positions where the source pillar S and the drain pillar D are to be formed, and then the source pillar S and the drain pillar D are formed. Alternatively, an insulating material (not shown) is first formed in the vertical channel holes VC1, and then through holes are etched to the surface of the etch-stop layer 302 at the positions where the source pillar S and the drain pillar D are to be formed. Then, the source pillar S and the drain pillar D are formed, and then the insulating pillar 312 is formed between the source pillar S and the drain pillar D.

Figure 5F:
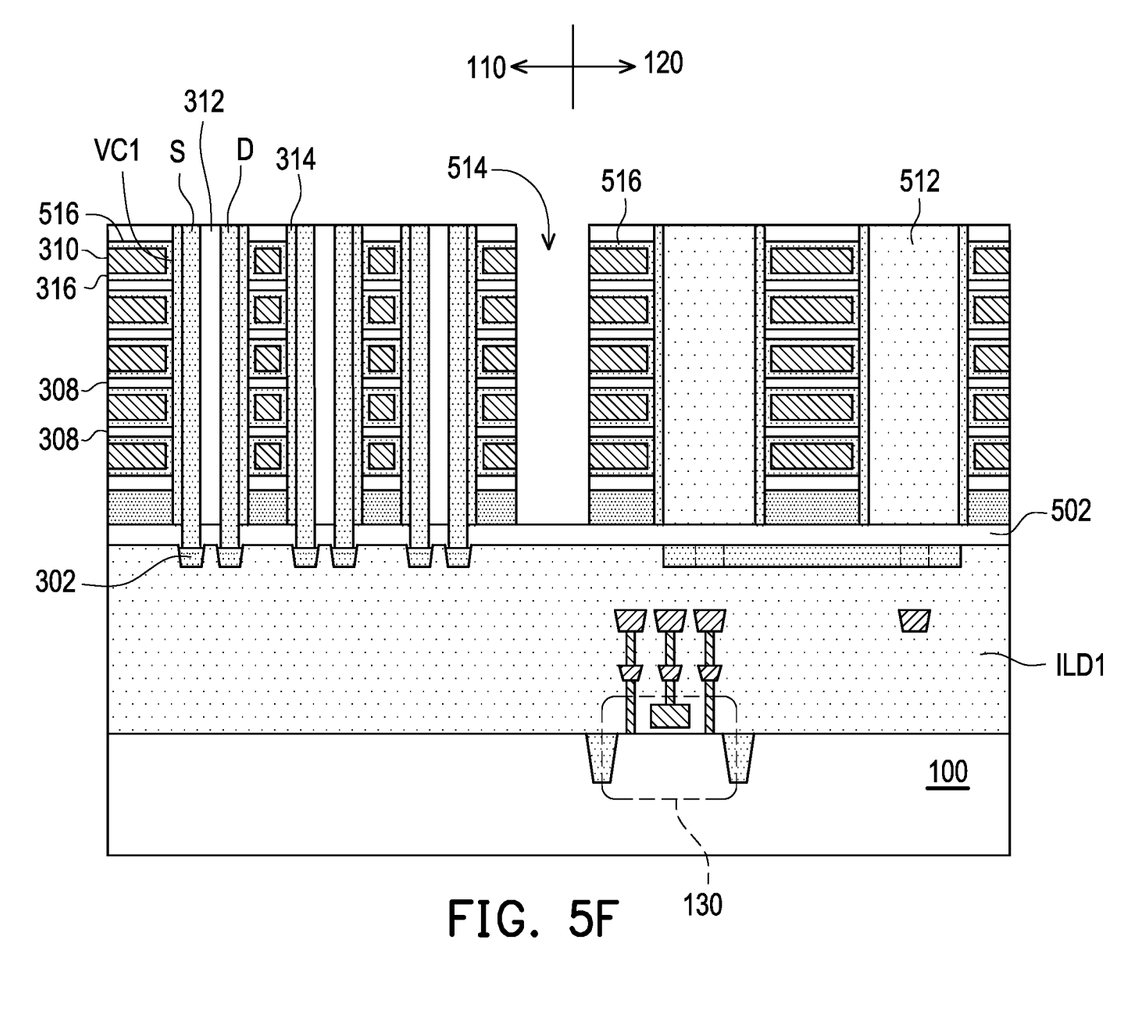

Next, referring to FIG. 5F, a slit 514 may be formed first at the junction of the memory cell region 110 and the passive device region 120 to expose the insulating layers 308 and the sacrificial layers 506 of the stack structure 508, and then the sacrificial layers 506 are removed, wherein the insulating layers 308 and the sacrificial layers 506 are preferably materials with a high etch selectivity, such as silicon oxide and silicon nitride. Therefore, the exposed sacrificial layers 506 may be completely removed from the slit 514 by dry etching or wet etching, thereby forming lateral openings 516. The lateral openings 516 expose the insulating layers 308 and a portion of the channel layer 314. Next, a charge storage layer 316 may be formed in the lateral openings 516. The charge storage layer 316 is, for example, a conformal layer. In detail, the charge storage layer 316 may conform to the profile of the lateral openings 516 to cover the insulating layers 308 and the channel layer 314 exposed by the lateral openings 516. Then, the gate layers 310 are filled in the lateral openings 516 as word lines (WL). The material of the gate layer 310 is, for example, polysilicon, amorphous silicon, tungsten (W), cobalt (Co), aluminum (Al), tungsten silicide ($WSi_x$), cobalt silicide ($CoSi_x$), etc. The method of forming the gate layers 310 may be, for example, a chemical vapor deposition method.

Figure 5G:
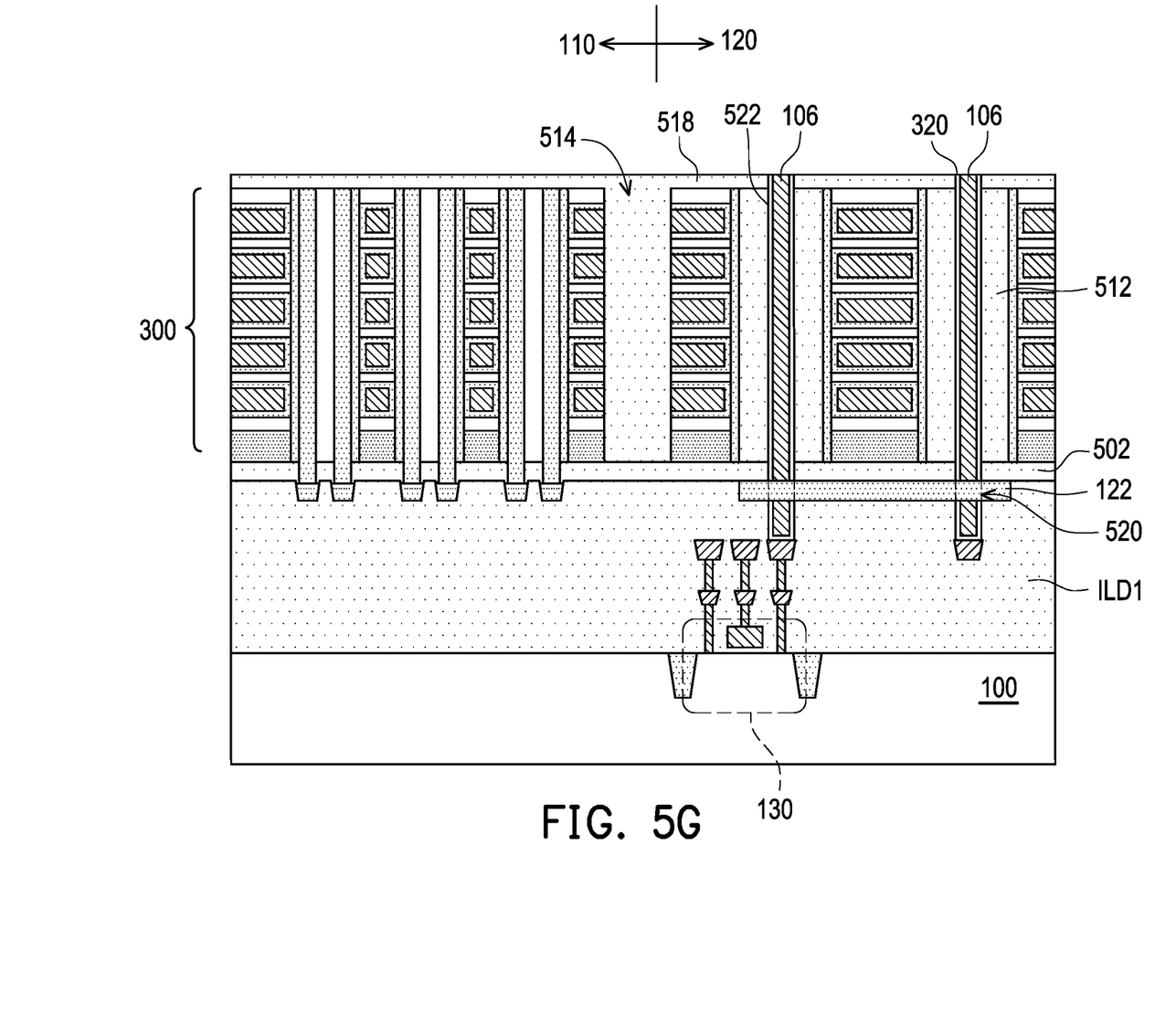

Next, referring to FIG. 5G, a dielectric layer 518 is formed on the entire substrate 100 to fill the slit 514 and planarize the surface of the entire structure, wherein the material of the dielectric layer 518 is, for example, a material similar to the insulating layer 502, such as silicon oxide. After that, the through-array vias (TAV) 106 are formed on the circuit 122 of the passive device region 120, and the through-array vias 106 may pass through the central opening 520 of the ring-type structure of the circuit 122 to be connected to a lower device, such as the CMOS 130. The step of manufacturing the through-array vias 106 includes, for example, first forming through holes 522 in the dielectric layer 512, the dielectric layer 518, the insulating layer 502, and the dielectric layer ILD1, and then forming the barrier layer 320 conformally on the surface of the through holes 522. Afterwards, metal (such as tungsten) is filled into the through holes 522 and a planarization process is performed to obtain the through-array vias 106. Moreover, the through-array vias 106 may be manufactured together with the through-array vias (not shown) of the 3D flash memory array 300.

Figure 5H:
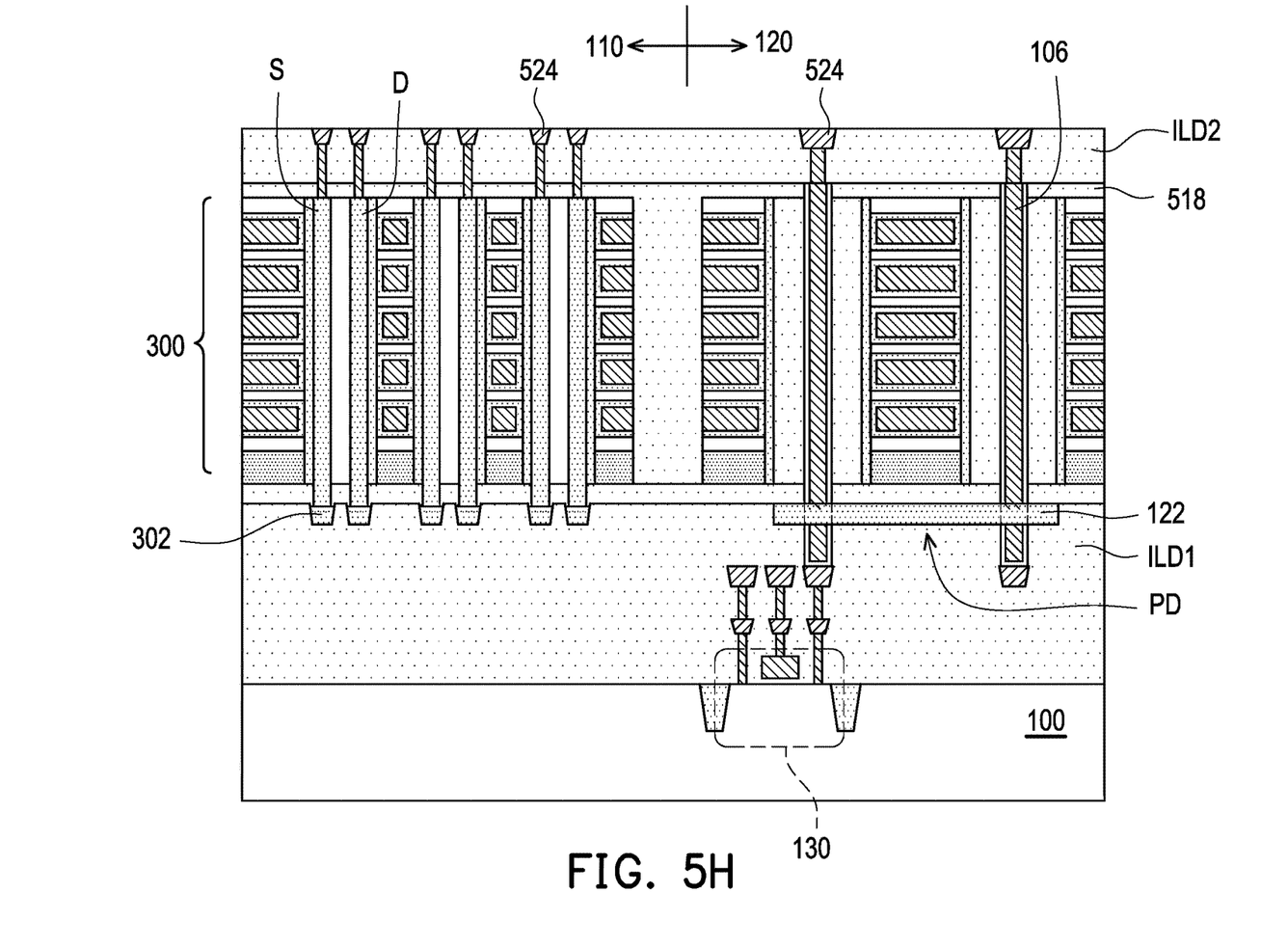

Next, referring to FIG. 5H, the dielectric layer ILD2 may be formed on the entire substrate 100 and the surface of the entire structure may be planarized, and then interconnects 524 are formed to be connected to the source pillar S and the drain pillar D in the 3D flash memory array 300 and the through-array vias 106 respectively.

The above is an example of a manufacturing process of a 3D flash memory device, but the invention is not limited thereto. As long as the circuit 122 of the passive device PD is manufactured together with the etch-stop layer 302 of the source pillar S and the drain pillar D of the 3D flash memory array 300, the manufacture and sequence of other layers and structures may be adjusted or increased or decreased according to requirements.

Figure 6:
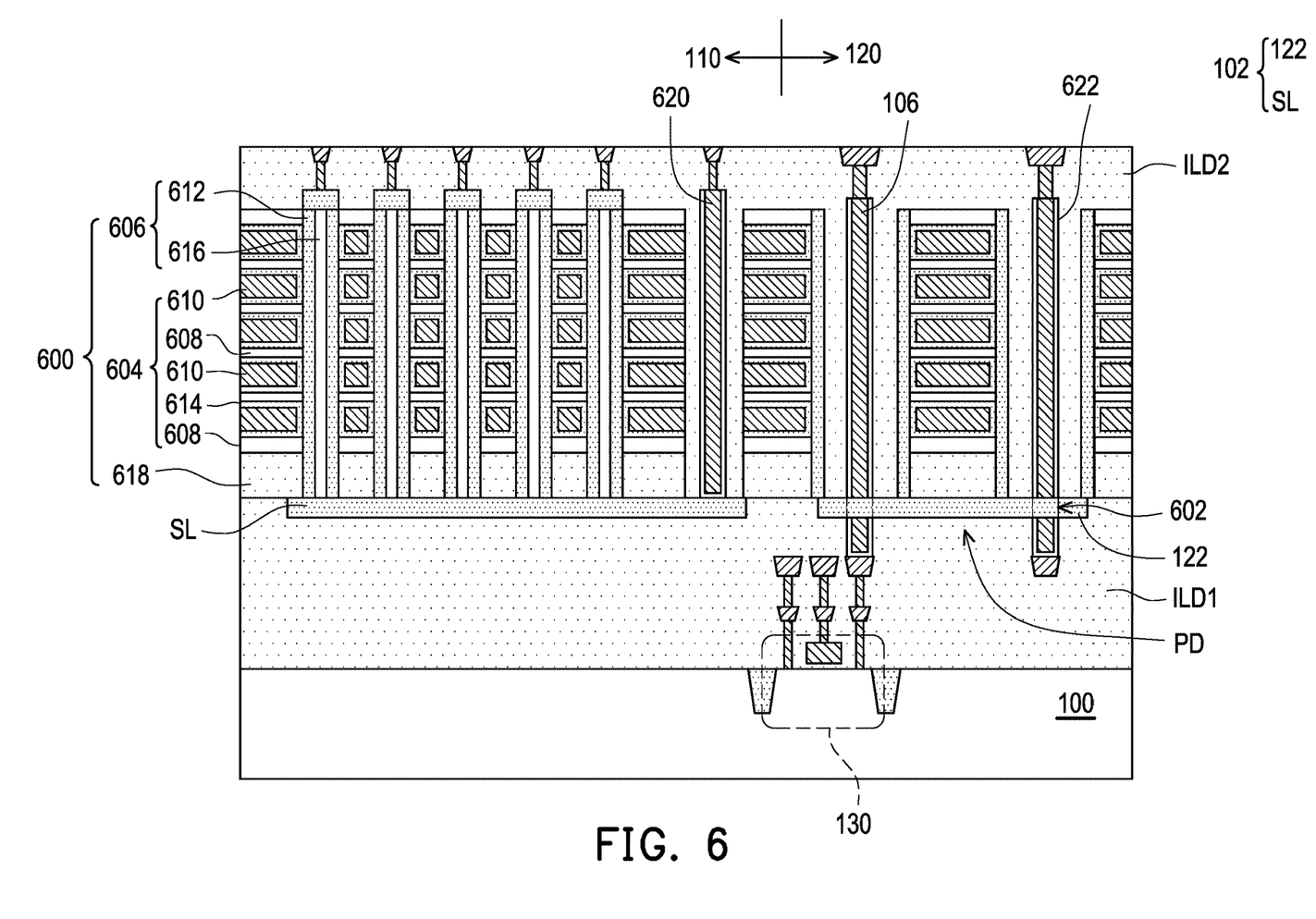
FIG. 6 is a schematic cross-sectional view of a 3D NAND flash memory device according to the third embodiment of the invention.

FIG. 6 is a schematic cross-sectional diagram of a 3D NAND flash memory device according to the third embodiment of the invention, wherein the same reference numerals as those in the first embodiment are used to indicate the same or similar parts and components, and related content of the same or similar parts and components is also as provided in the content of the first embodiment and is not repeated herein.

Referring to FIG. 6, the 3D NAND flash memory device of the present embodiment includes the substrate 100, the conductive layer 102, a 3D NAND flash memory array 600, and the through-array vias (TAVs) 106. The substrate 100 includes the memory cell region 110 and the passive device region 120. The conductive layer 102 is formed on the substrate 100, and the conductive layer 102 includes: the (second) circuit 122 of the passive device PD disposed at the passive device region 120 and the source line SL disposed at the memory cell region 110. The 3D NAND flash memory array 600 is formed on the source line SL of the memory cell region 110. The through-array vias 106 are respectively formed on the circuit 122 of the passive device region 120 and connected to the circuit 122 and a central opening 602 of the ring-type structure passing through the circuit 122 to be connected to a lower device, such as the CMOS 130.

Please continue to refer to FIG. 6. The 3D NAND flash memory array 600 may include a stack structure 604 and a pillar structure 606. The stack structure 604 includes insulating layers 608 and gate layers 610 alternately disposed, wherein the conductive layers 610 may be metal layers, such as tungsten or other metal materials. A plurality of charge storage layers 614 surround the gate layers 610. Each of the charge storage layer 614 is between the respective gate layer 614 and insulating layer 608. The pillar structure 606 penetrates the stack structure 604. The pillar structure 606 may include an insulating material 616 forming an insulating pillar as a central structure and a channel pillar 612 (e.g. polysilicon) surrounding external surface of the insulating pillar. The channel pillar 612 is extended to the surface of the source line SL. The charge storage layers 614 surrounds a portion of the channel pillar 612 and is in contact with the gate layers 610 of the stack structure 604. In addition, an insulating layer 618 may be disposed between the 3D NAND flash memory array 600 and the source line SL to prevent the source line SL from interfering with the gate layers 610 of the stack structure 604. For the passive device PD, refer to the description of the first or second embodiment above, which is not repeated herein. The through-array vias 106 may be formed together with another through-array via 620 connected to the source line SL, and therefore no additional photomask process is needed. In the present embodiment, the through-array vias 106 are, for example, tungsten plugs, and therefore a barrier layer 622 (such as Ti/TiN) may be disposed between the through-array vias 106 and the dielectric layer ILD2.

Based on the above, in the invention, passive devices (such as capacitors or resistors) are manufactured together with the circuits in the 3D flash memory array via process design, and therefore no additional photomasks and manufacturing processes are needed, and therefore manufacturing cost is reduced. Moreover, compared with the original method of manufacturing passive devices separately, the probability of defect formation may also be reduced.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A 3D flash memory device, comprising:
   a substrate comprising a memory cell region and a passive device region;
   a conductive layer formed on the substrate, wherein the conductive layer comprises: a first circuit disposed at the memory cell region and a second circuit of a passive device disposed at the passive device region;
   a 3D flash memory array formed on the first circuit of the memory cell region; and
   a plurality of through-array vias (TAVs) respectively formed on the second circuit of the passive device disposed at the passive device region and connected to at least one end of the second circuit, wherein
   the at least one end of the second circuit is a ring-type structure, and one of the through-array vias further penetrates a central opening of the ring-type structure to be connected to a lower device.

2. The 3D flash memory device of claim 1, wherein the 3D flash memory array is a 3D AND flash memory array, and the first circuit is an etch-stop layer at a bottom of a source pillar and a drain pillar in the 3D AND flash memory array.

3. The 3D flash memory device of claim 1, wherein the 3D flash memory array is a 3D NAND flash memory array, and the first circuit is a source line in the 3D NAND flash memory array.

4. The 3D flash memory device of claim 1, wherein the passive device comprises a capacitor or a resistor.

5. The 3D flash memory device of claim 1, wherein the second circuit of the passive device comprises a snake-shaped circuit or an interdigital circuit.

6. The 3D flash memory device of claim 1, wherein the lower device comprises a CMOS (complementary metal-oxide-semiconductor).

7. A 3D flash memory device, comprising:
   a substrate comprising a memory cell region and a passive device region;
   a conductive layer formed on the substrate, wherein the conductive layer comprises: a circuit of a passive device disposed at the passive device region and an etch-stop layer disposed at the memory cell region;
   a 3D flash memory array formed on the etch-stop layer of the memory cell region, wherein the 3D flash memory array comprises:

a stack structure comprising a plurality of insulating layers and a plurality of gate layers alternately disposed; and a plurality of pillar structures penetrating the stack structure, each of the pillar structure comprising:
an insulating pillar;
a source pillar and a drain pillar located at two sides of the insulating pillar and extended to a surface of the etch-stop layer;
a channel layer surrounding the source pillar and the drain pillar and in contact with the source pillar and the drain pillar; and
a charge storage layer surrounding the channel layer and in contact with the gate layers of the stack structure; and a plurality of through-array vias (TAVs) respectively formed on the circuit of the passive device region and connected to at least one end of the circuit, wherein the at least one end of the circuit is a ring-type structure, and one of the through-array vias further penetrates a central opening of the ring-type structure to be connected to a lower device.

8. The 3D flash memory device of claim 7, wherein the charge storage layer comprises a multiple layer.

9. The 3D flash memory device of claim 7, wherein the passive device comprises a capacitor or a resistor.

10. The 3D flash memory device of claim 7, wherein the circuit of the passive device comprises a snake-shaped circuit or an interdigital circuit.

11. A 3D NAND flash memory device, comprising:
a substrate comprising a memory cell region and a passive device region;
a conductive layer formed on the substrate, wherein the conductive layer comprises: a circuit of a passive device disposed at the passive device region and a source line disposed at the memory cell region;
a 3D NAND flash memory array formed on the source line of the memory cell region; and
a plurality of through-array vias (TAVs) respectively formed on the circuit of the passive device region and connected to at least one end of the circuit, wherein
the at least one end of the circuit is a ring-type structure, and one of the through-array vias further penetrates a central opening of the ring-type structure to be connected to a lower device.

12. The 3D NAND flash memory device of claim 11, wherein the 3D NAND flash memory array comprises:
a stack structure comprising a plurality of insulating layers and a plurality of gate layers alternately disposed; and
a plurality of pillar structures penetrating the stack structure, each of the pillar structures comprising:
a channel pillar extended to a surface of the source line; and
a charge storage layer surrounding the channel pillar and in contact with the gate layer of the stack structure.

13. The 3D NAND flash memory device of claim 11, wherein the passive device comprises a capacitor or a resistor.

14. The 3D NAND flash memory device of claim 11, wherein the circuit of the passive device comprise a snake-shaped circuit or an interdigital circuit.

15. The 3D NAND flash memory device of claim 11, wherein the lower device comprises a CMOS (complementary metal-oxide-semiconductor).

* * * * *